United States Patent [19]

Barndt, Sr.

[11] Patent Number: 4,809,303

[45] Date of Patent: Feb. 28, 1989

[54] DYNAMIC SPEED SHIFTER FOR FIBER OPTIC WORK STATION

[75] Inventor: Robert A. Barndt, Sr., Coatesville, Pa.

[73] Assignee: Unisys Corporation, Blue Bell, Pa.

[21] Appl. No.: 121,389

[22] Filed: Nov. 16, 1987

[51] Int. Cl.[4] .................... H04L 7/02; H04B 17/00
[52] U.S. Cl. .................................. 375/110; 375/10; 455/608
[58] Field of Search ............... 375/10, 87, 95, 110; 328/108, 109; 360/40, 48, 51; 370/84; 364/484; 455/608

[56] References Cited

U.S. PATENT DOCUMENTS 4,584,694 4/1986 Gumacos .............................. 375/10
4,584,719 4/1986 Miller ................................... 455/608

Primary Examiner—Benedict V. Safourek
Assistant Examiner—Marianne Huseman
Attorney, Agent, or Firm—Albert B. Cooper; Arnold L. Albin

[57] ABSTRACT

A synchronous counter operating from a fixed frequency time base senses the data rate of an incoming bit stream and provides a time base synchronized with the incoming data. Detection of the data rate is accomplished in real time without software or user intervention. A two-stage counter, clocked by a crystal oscillator, is triggered by transitions of bi-phase data pulses. The circuit automatically shifts the frequency of operation to conform to the incoming data rate and returns to the high speed mode upon the cessation of low speed data rates.

16 Claims, 3 Drawing Sheets

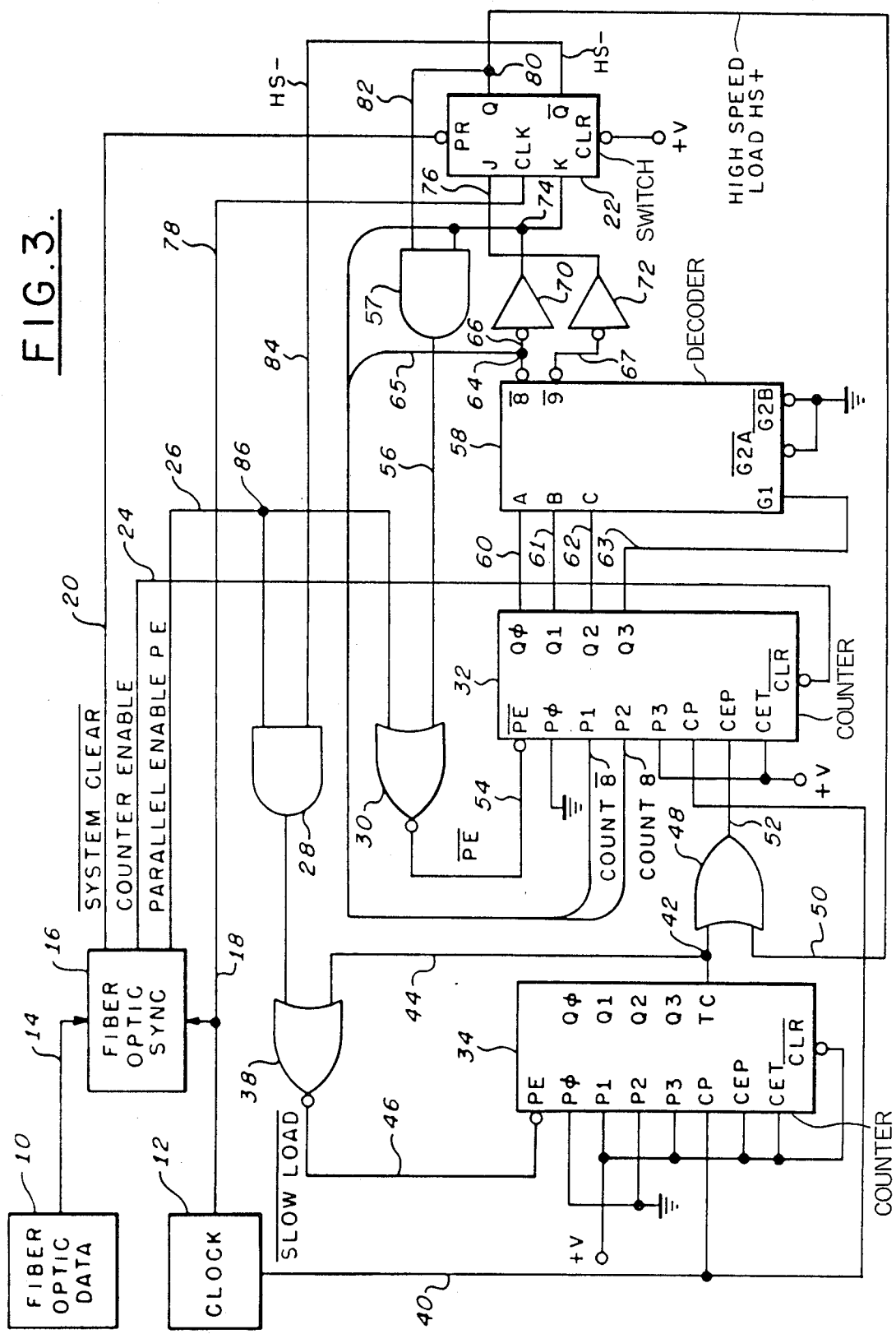

DYNAMIC SPEED SHIFTER FOR FIBER OPTIC WORK STATION

BACKGROUND OF THE INVENTION

1. Field of the Invention

The present invention relates generally to fiber optic data transmission systems, and more particularly to an apparatus for detecting and determining the data rate of an incoming digital signal for use in a fiber optic work station capable of operation in a plurality of data rates without user or software intervention.

2. Description of the Prior Art

Fiber optics have been found to be particularly efficient for transmission of digital data between computer work stations. A present day work station configuration may employ multiple slave work stations, wherein advances in technology have permitted newly emplaced work stations to operate at a higher data rate then the earlier emplaced work stations. For example, while the older work stations may operate at a maximum of 307.2 Kbit/sec, a present day work station may operate at 1.8 Mbit/sec. It is desirable to utilize both the earlier and the technologically improved work stations on a common system. One prior art system has required the computer interface to interrogate each work station, read the operational speed in software, and downshift or upshift the data transmission rate accordingly. Thus, if there is a single work station operating at 307.2 Kbit/sec, the data transmission rate must be downgraded accordingly. It is desirable, however, that the improved work stations be indpendently capable of detecting the data rate of the incoming data so that it may be automatically adapted to the data transmission rate without software intervention. In particular, it is desirable that such rate recognition occur dynamically without significant loss of data.

An asynchronous circuit for dynamically recognizing rates of data transmission is taught by Bruce J. Miller in U.S. Pat. No. 4,584,719, Fiber Optic Work Station Data Link Interface. An asynchronous data transmission system requires that start and stop information be transmitted in addition to the data, since both the transmitter and receiver have to sense when valid data is being sent. This results in a reduction is efficiency, since the useful bit density is diminished and additional logic must be provided to decode the synchronizing data bits. The present invention operates synchronously and therefore does not require transmission of start and stop information. It is capable of recognizing the start and stop of data transmission directly from the encoded data. It has the advantage of keeping many diverse units in step with each other, since circuit performance is predictable at any given point and time, and also requires less logic in the individual device units.

The present invention is capable of detecting the incoming data rate and downshifting to match the clock rate on the system transmission lines without software or user intervention.

SUMMARY OF THE INVENTION

In accordance with the present invention, an apparatus for determining the bit rate of an incoming encoded data stream transmitted in at least one of a plurality of bit rates comprises means for receiving the encoded data at a given one of the bit rates, means for synchronizing transmissions of the encoded data with a source of clock pulses and providing a signal corresponding thereto, counter means responsive to the clock pulses and also responsive to the synchronized transmissions having an output terminal for providing a first count corresponding to the given one of the bit rates when at least one transition occurs during a predetermined bit period corresponding to the bit period of the given bit rate, and a second count corresponding to a further given one of the bit rates when no transition occurs during a period substantially greater than the first mentioned bit period, but less than twice the bit period, and switch means responsive to the first and second counts for providing an output representative thereof.

BRIEF DESCRIPTION OF THE DRAWINGS

FIG. 3 is a schematic diagram showing the counter circuitry of the present invention.

DESCRIPTION OF THE PREFERRED EMBODIMENT

Figure 1:
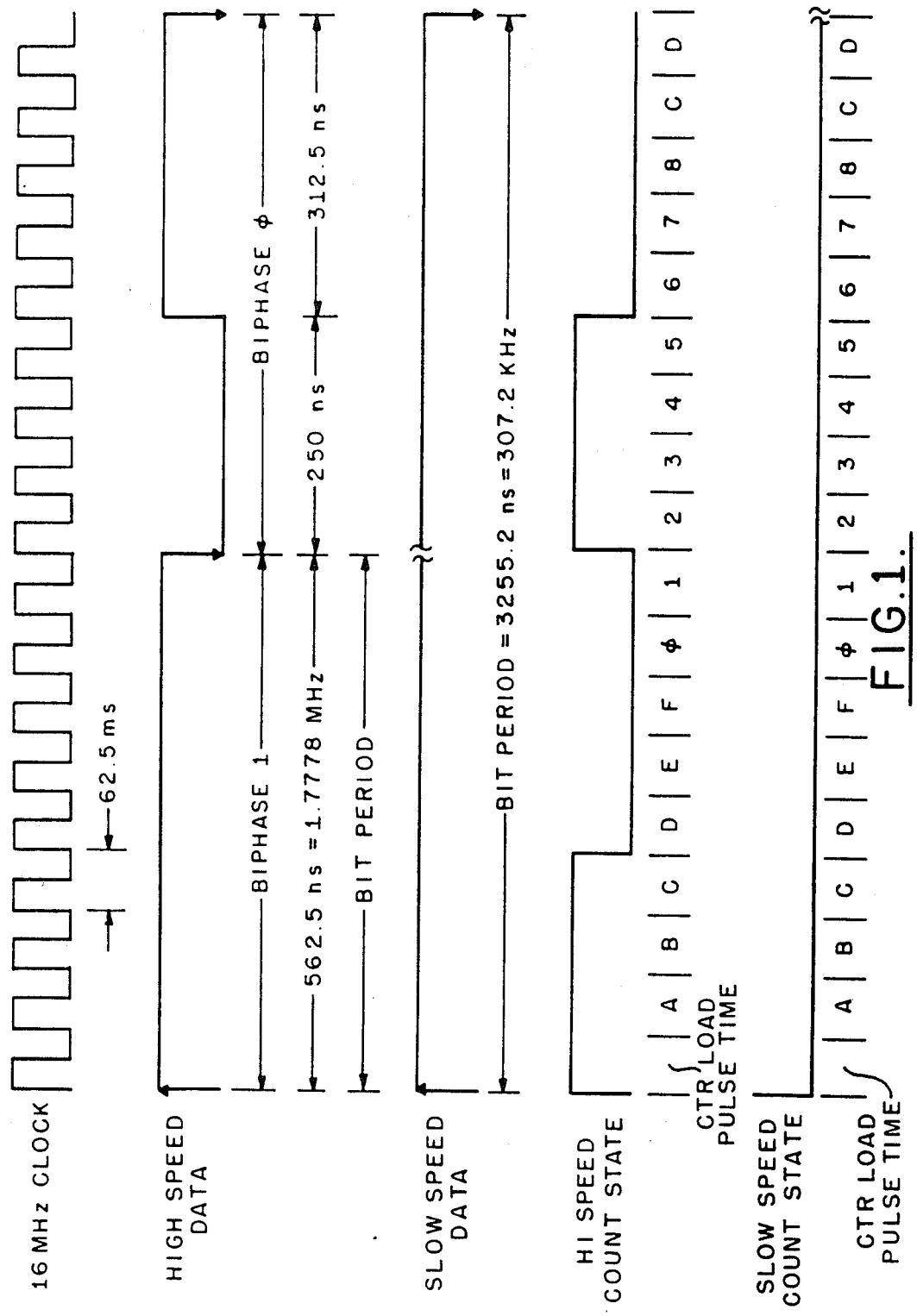
FIG. 1 is a waveform timing diagram showing the relationship of the high speed and low speed modes of operation.
Figure 2:
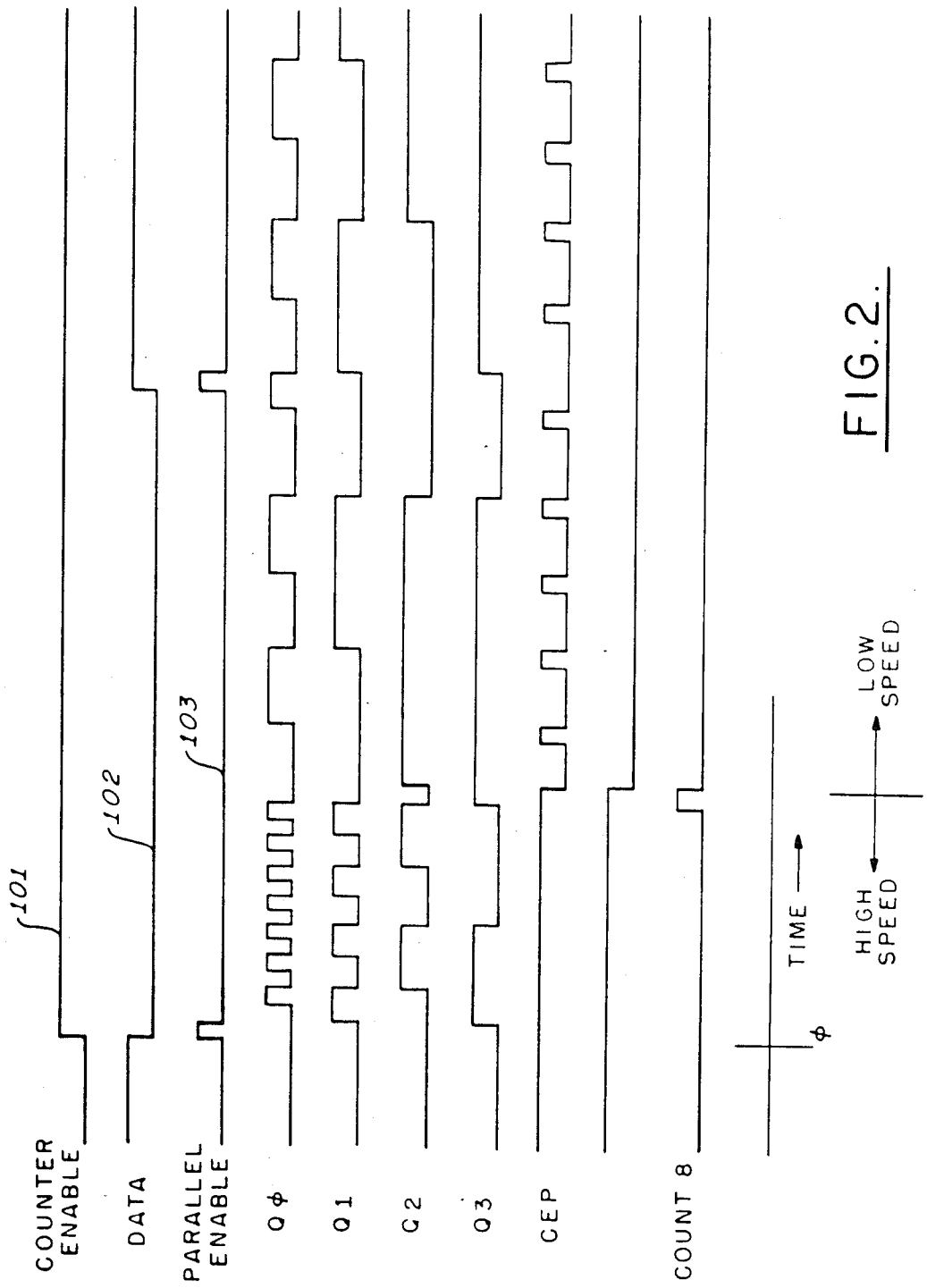
FIG. 2 is a waveform showing the timing relationship of control signals and counter waveforms of the present invention.

A fiber optic work station of the present invention preferably employs a 16 MHz clock which has a period of 62.5 ns as shown in FIG. 1. Bi-phase zero encoded data is transmitted to the work station and is a self-clocking serial data transmission code. FIG. 2 is a timing diagram showing waveforms of the input and output signals. As seen in FIG. 1, a transition denoted by an arrow, occurs at the edge of every data bit period. A logic "1" has no transitions between the leading and trailing edges of the data bit period. A logic "0" is represented by an additional transition which occurs approximately at mid-bit time. In the present invention, the bit period of high speed data is 562.5 ns, corresponding to a given bit rate of the incoming encoded data stream of 1.7778 Mhz. The bi-phase zero code provides a transition at 250 ns of the total bit period. This bit rate is referred to as "high speed." slow speed data, which occurs at a further bit rate of 307.2 KHz has a corresponding bit period of 3255.2 ns. Thus, it may be seen that the high speed data and slow speed data are related by a frequency ratio of approximately six to one.

With continued reference to FIG. 1, a high speed bi-phase data bit period, when clocked at 16 MHz, is seen to be comprised of 9 data bit intervals, each interval of 62.5 ns duration. Correspondingly, a slow speed data bit period is seen to be comprised of 52 data bit intervals of 62.5 ns duration.

The present invention is so constructed and arranged as to detect and time the intervals between transitions of the encoded data. It may be seen from FIG. 1 that high speed data is accompanied by a transition every 562.5 ns for logic 1 data and 250 ns (281.25 ns for an ideal waveform) for logic 0 data. By arranging a counter to count the data bit intervals between successive transitions, the system can detect whether the incoming data stream represents high speed or low speed data. It can be seen from FIG. 1 that if the counter reached a count state of 8(hex) then to transition occured between count 1 (hex) and 2 (hex). The value of count 8(hex) is chosen to provide a sensing period of approximately one and three quarters of a high speed bit period in order to provide greater assurance that slow speed data has been detected and allow for perturbations in the received data.

Referring now to FIG. 3 with continued reference to FIG. 2 there is shown a schematic diagram of the present invention. Fiber optic data, which has been encoded in bi-phase format, is converted to electrical digital signals, such as an RS422A format, in receiver 10. A clock 12 provides regularly occuring clock pulses, preferably at a 16 MHz rate. The encoded fiber optic data from receiver 10 is applied on line 14 to a fiber optic synchronizing circuit 16, which synchronizes the fiber optic data 102 with the clock signals applied on line 18 and generates required system timing waveforms. A system clear signal having a logic 0 value of approximately 400 ns duration is generated at initial power up of the system. This waveform is applied on line 20 to preset flip-flop 22 to the high speed mode, denoted by a logic high at output Q. Flip-flop 22 is a bistable multivibrator whose function is to be described. A counter enable signal 101 on line 24, synchronized with the fiber optic data 102 is applied to clear counter 32 on power up. It may be seen that the counter enable signal 101 is at a logic low until time 0 when fiber optic data 102 is applied and remains at a logic high so long as the transmission of fiber optic data continues. Waveform 102 represents synchronized low speed bi-phase encoded data. Signal 103, parallel enable, is coupled on line 26 to node 86, and one input of AND gate 28 and an NOR gate 30. Waveform 103 shows that the parallel enable signal PE is coincident with the encoded data transitions. The function of signal PE is to parallel load counters 34 and 32 via gates 28 and 38 and gate 30 respectively to assure that the desired count sequence is properly synchronized with the encoded data. Counters 32 and 34 are fully synchronous 4-bit binary counters. With the parallel enable ($\overline{PE}$) input low, data on the P0-P3 inputs is parallel loaded on a positive clock transition at terminal CP. Counting will occur on the low-to-high clock transition when $\overline{PE}$ goes high and both count enables CEP and CET are also high. When counter 34 is in its terminal count state, f(hex)$_2$ it provides a high output at TC. Since CET/CEP (Count Enable Trickle Input/Count Enable Parallel Input) are tied high, when the counter is in its terminal count state, then TC is also high. The counter has an asynchronous master reset $\overline{CLR}$. A low level on the $\overline{CLR}$ input forces the Q output low independent of all other inputs.

Counter 34 is adapted for counting in a divide by six mode. This is achieved by parallel connecting terminals P0-P3 to load a 1010 or logic A(hex) when the counter is enabled by signal $\overline{PE}$ from NOR gate 38. NOR gate 38 is activated when a bit rate of 307.2 Kbit detected by a change in the logic state of flip-flop 22 applies a signal $\overline{Q}$ to gate 28 allowing parallel enable PE to pass through. Clock 12 furnishes a clock pulse on line 40 to the CP inputs of counters 34 and 32. The TC output of counter 34 is coupled in closed-loop fashion via node 42 and lead 44 to a second input of NOR gate 38. The output of gate 38 is coupled via lead 46 back to terminal $\overline{PE}$ of counter 34. This has the effect of allowing counter 34 to be always running in the slow speed mode, even in the absence of a signal denoting detection of a slow speed bit rate. However, when the slow speed bit rate is detected, then counter 34 will be synchronized via NOR gate 38 and AND gate 28 with the incoming data bit stream, as follows.

The TC output of counter 34 is also coupled via node 42 to one input of an OR gate 48. A second input of OR gate 48 is coupled via line 50 to the Q output of flip-flop 22. The output of OR gate 48 is coupled on line 52 to the CEP terminal of counter 32 so that counter 32 is synchronized with counter 34 in the slow speed mode. The TC output occurs once in every six 62.5 ns clock pulses so that counter 32 counts once every sixth 62.5 ns clock pulse. Counter 32 is thereby synchronized with counter 34 and the incoming slow speed data bit stream.

Counter 32 has its parallel input terminals P0-P3 wired for parallel loading either a logic A or a logic C depending on the mode of operation. The parallel enable terminal $\overline{PE}$ is coupled via lead 54 to the output of a NOR gate 30. NOR gate 30 is primed by the parallel enable signal PE on line 26 at node 86 at each transition of a data bit or maintained in an inoperative condition by the signals on line 56 from AND gate 57, whose function is to be described. Outputs Q0-Q2 of counter 32 are coupled to the A, B, and C inputs of a decoder 58. Decoder 58 serves to decode the binary outputs of counter 32 to indicate when a count 8 or a count 9 has been reached. The count 8 is used as a criterion for the detection of the 307.2 bit rate, while the count 9 is used to indicate the cessation of the data stream. The three inputs A, B, and C are decoded to select one of eight outputs, only two of which are used here. When the enable input G1 is in a logic low condition, outputs $\overline{8}$ and $\overline{9}$ are at a logic high. When input G1 is at a logic high, the binary signals on lines 60, 61, and 62 from counter 32 will be decoded, thereby generating a count $\overline{8}$ or $\overline{9}$ when a corresponding count has been reached.

The output $\overline{8}$ of decoder 58 is coupled on line 66 to inverter 70 and via node 74 to one input of AND gate 58 and to the K input of JK flip-flop 22. The $\overline{9}$ output of decoder 58 is coupled on line 67 to inverter 72 and the output thereof on line 76 to the J input of flip-flop 22. The clock terminal CLK receives regular clock pulses from clock 12 via line 78. The Q terminal of flip flop 22 is coupled via node 80 and line 82 to a second input of AND gate 58. Node 80 is also coupled via line 50 to one input of OR gate 48. The $\overline{Q}$ output of flip-flop 22 feeds one input of a second AND gate 28 via line 84.

The parallel enable signal PE generated by synchronizer 16 is coupled via lead 26 and node 86 in common to an input terminal of AND gate 28 and NOR gate 30.

The foregoing circuit arrangement results in the following operation. Referring not to FIG. 1 and FIG. 2, with continued reference to FIG. 3, the main crystal time base frequency is typically 16 MHz. At a high speed bit rate of 1.7778 MHz one bit period will occupy 9 clock cycles. In the high speed count state, the parallel enable signal $\overline{PE}$ on the next clock pulse will load an A(hex) in a manner to be described into the main counter 32. Valid high speed data will cause a transition for each period of 562.5 ns for ones data or zero data. Parallel Enaable PE timing will not be generated at the middle transition of a valid zero data. Therefore, high speed data will normally cause a reloading of a logic A at the end of a count of 2, denoting that a time duration of 562.5 ns has been reached. As shown in the slow speed count state waveform, since no transition occurs between counts 1 and 2, counter 32 continues to increment until a count of 8 is reached. After the first count 8 is reached, a circuit is so arranged as to load a logic C whose purpose will be described. In the present circuit, a count 8 is used to initiate the slow speed down shift to 307.2 KHz. A count of 8 indicates a period of 937.5 ns, which is greater than one and three quarters of the high speed bit period to provide assurance that slow speed data has been detected. Once slow speed operation has been acquired the circuit will inhibit succeeding count eights. The circuit will remain in the slow speed state until no more transitions are sensed. At that time counter 32 will be allowed to count to logic 8 and a count 9 will reset the counter to the high speed mode. The process will be repeated upon the receiving of a new packet of slow speed fiber optic encoded data.

Referring now to FIG. 3, a bistable multivibrator, conventionally referred to as flip-flop 22 is preset by the system clear signal 20 on initially powering up so that the Q terminal is an active high signal. Thus, on power up the system will be activated in the high speed mode. On the first transition of the fiber optic data, the parallel enable signal PE is generated by synchronizer 16. Since decoder 58 is in a condition where the 8 and 9 terminals are a logic 1, inverter 70 will apply a logic 0 to AND gate 58 and the K terminal of flip-flop 22. Since the signal on line 82 is at a logic 1, the output of AND gate 58 is a logic 0. Therefore, NOR gate 30 responds only to the PE pulse from synchronizer 16. Since node 64 is coupled to terminal P1 and node 74 is coupled to terminal P2 of counter 32, P1 is at a logic high and P2 is at a logic low, resulting in a parallel load of A(1010hex). Because terminal Q of flip-flop 22 has been initialized to a logic high condition on power up, OR gate 48 blocks the TC pulses from counter 34 from being transmitted to terminal CEP of counter 32. Therefore, on the next clock after a $\overline{PE}$ signal is generated, a logic A is loaded into counter 32 and it will begin to increment with each succeeding clock pulse.

When a slow speed bit rate is applied, counter 32 will increment to a count 8. The count 8 after being decoded by decoder 58 will generate a logic low at node 64 and a logic high at node 74. On the next clock pulse flip-flop 22 will be reset causing terminal Q to go to a logic low and terminal $\overline{Q}$ to a logic high. Terminals P0-P3 of counter 32 will be loaded with a C(1100hex) by virtue of the signals applied from nodes 64 and 74. Simultaneously, since the signal on line 50 has gone to a logic low, the TC count generated by counter 34 will be transmitted through gate 48 to the CEP terminal of counter 32. Every sixth system clock pulse a TC count is generated by counter 34 which will enable counter 32 to count at the slow bit rate. Since terminal $\overline{Q}$ of flip-flop 22 is now at a logic high, AND gate 28 will be enabled and allow the PE signal on line 26 through AND gate 28. The PE output from AND gate 28 is applied to NOR gate 38 where it is inverted to form $\overline{PE}$ and applied on line 46 to terminal $\overline{PE}$ of counter 34. This results in synchronizing counters 32 and 34 with each valid transition pulse. The change in state of decoder 58 results in force loading a count of C(1100hex) to counter 32. A C is used to force load the counter, at this time, because the high speed logic 8 count is phased to occur at exactly the same point in time as a logic C count of a normal low speed bit period. Once slow speed operation has been acquired, succeeding count eights are blocked out by AND gate 57, since the signal on lead 82 is now at a logic low condition, thus disabling any further transmission of count 8.

Flip-flop 22 will not be set until counter 32 is allowed to count to 9. Once the low speed data ends, there will be no transition applied to terminal $\overline{PE}$ of counter 32, and counter 32 will increment to a count of 9. This will provide a logic low on line 67 to inverter 72 and apply a logic high to terminal J of flip-flop 22, setting the flip-flop, at the Q output, to a logic high condition and the high speed mode. Thus, the system is always initialized in the high speed mode and reset to the high speed mode upon termination of low speed data.

Counters 32 and 34 are convventional integrated circuit binary counters such as AMD93S16, as manufactured by Advanced Micro Devices, Sunnyvale, Calif. Decoder 58 is a 3-line to 8-line decoder/demultiplexer, such as TI 74S138. A suitable device for JK flip-flop 22 is 74S112, as manufactured by Texas Instruments, Dallas, Tex.

While the invention has been described in its preferred embodiment, it is to be understood that the words which have been used are words of description rather than limitation and that changes may be made within the purview of the appended claims without departing from the true scope and spirit of the invention in its broader aspects.

I claim:

1. Apparatus for determining the bit rate of an incoming encoded data stream transmitted in at least one of a plurality of bit rates, comprising:

means for receiving said encoded data at a given one of said bit rates, means coupled to said receiving means for synchronizing transitions of said encoded data with a source of clock pulses and providing s signal corresponding thereto, counter means responsive to said clock pulses and also responsive to said synchronized transitions and having an output terminal for providing a first count corresponding to said given one of said bit rates when at least one transition occurs during a predetermined bit period corresponding to the bit period of said given bit rate, and a second count corresponding to a further given one of said bit rates when no transition occurs during a period subtantially greater than said predetermined bit period but less than twice said predetermined bit period, decoder means responsive to said counter means for providing a logic output indicative of a predetermined state; and switch means responsive to said decoder means for providing an output indicative of said first or second counts.

2. Apparatus for determining bit rate as set forth in claim 1, wherein said counter means further comprises first counter means, said first counter means having an input terminal for loading a further predetermined count when energized and an output terminal for providing an output signal when said first counter means has been incremented by said clock pulses to a terminal count, said first counter means being adapted by loading said further predetermined count to count in a mode whereby said output signal is provided once for a predetermined number of clock pulses substantially corresponding to the ratio of said given bit rate and said further bit rate.

3. Apparatus for determining bit rate as set forth in claim 2, further comprising first NOR gate responsive to said means for synchronizing and to said output signal of said first counter means for coupling a signal to said input terminal of aid first counter means corresponding to the detection of said further one of said bit rates or said output signal of said first counter means.

4. Apparatus for determining bit rate as set forth in claim 3, further comprising second counter means having a first input terminal for loading a still further predetermined count when energized, said still further predetermined count representative of the bit rate of said encoded data, a second input terminal coupled to receive said output signal of said first counter means and to urge said second counter means to be incremented when energized and to inhibit said second counter means when deenergized, and a plurality of outputs representative of the binary state of said second counter means.

5. Apparatus for determining bit rate as set forth in claim 4, further comprising OR gate means coupled intermediate said first counter means and said second counter means to receive said output signal of said first counter means and a signal from said switch means corresponding to said predetermined state of said decoder means indicative of said first or second counts and to provide an output indicative of an applied signal to said second input terminal of said second counter means.

6. Apparatus as set forth in claim 5, wherein said decoder means is coupled to receive said plurality of outputs of said second counter means and to provide first and second outputs to said switch means, said first output of said decoder means corresponding to said second count and said second output of said decoder means corresponding to a count exceeding said second count and indicative of the end of a data stream, said plurality of outputs causing said decoder to selectively energize said first or second outputs of said decoder means in accordance with the presence or absence of a data bit stream.

7. Apparatus as set forth in claim 6, said switch means further comprising bistable multivibrator means having first and second input terminals coupled respectively to said first and second outputs of said decoder means, and having a first output terminal coupled to said first NOR gate means to energize said first counter means and a second output terminal coupled to said OR gate means to energize said second counter means, the switching of said multivibrator means being indicative of the detection of said encoded date at one of said given bit rate or said further given bit rate.

8. Apparatus as set forth in claim 7, further comprising first AND gate means having a first input terminal responsive to a stable state of said means indicative of the detection of said encoded data at said given one of said bit rates and a second input terminal coupled to said first output of said decoder means, said AND gate means operative to provide an output signal upon a fist occurance of said second count and nonoperative upon succeeding occurances of said second count.

9. Apparatus as set forth in claim 8, further comprising second AND gate means having a first input terminal coupled to receive said synchronized transition signals and a second input terminal coupled to receive a signal from said switch means indicative of said further given one of said bit rates, so that an output is provided upon the occurance of said transition signal only when said further bit rate has been detected, said output being coupled to energize said first OR gate means in synchronism with said transition signal.

10. Apparatus as set forth in claim 9, further comprising second NOR gate means, having a first input terminal coupled to receive said output signal from said first AND gate means and a second input terminal coupled to receive said synchronized transition signals, said second gate means having an output coupled to said first input terminal of said second counter means for energizing said second counter means upon said transitions of encoded date or upon said first occurance of said second count.

11. The apparatus as set forth in claim 10, further comprising inverter means coupled respectively between said first and second outputs of said decoder means and said first and second input terminals of said switch means for inverting said decoder outputs.

12. The apparatus as set forth in claim 11, wherein said plurality of bits rates are 1.7778 Mbits/sec and 307.2 Kbits/sec, said first mentioned bit rate having a bit period of 562.5 nanoseconds and said second mentioned bit rate having a bit period of 3255 nanoseconds.

13. Apparatus as set forth in claim 12, wherein said given one of said bit rates if 1.7778 Mbits/sec, said further given one of said bit rates is 307.2 Kbits/sec, and said pulses occur at a rate of 16 MHz.

14. Apparatus as set forth in claim 13, wherein said predetermined count period is 562.5 nanoseconds and said predetermined count of said first counte means is an A(hex).

15. Apparatus as set forth in claim 14, wherein said count ratio of said first counter means is six clock pulses for one output pulse.

16. Apparatus as set forth in claim 15, said further predetermined count comprising an A(hex) when a 1.7778 Mbit signal is detected and a C(hex) when a 307.2 Kbit signal is detected.

* * * * *